Figure 1:
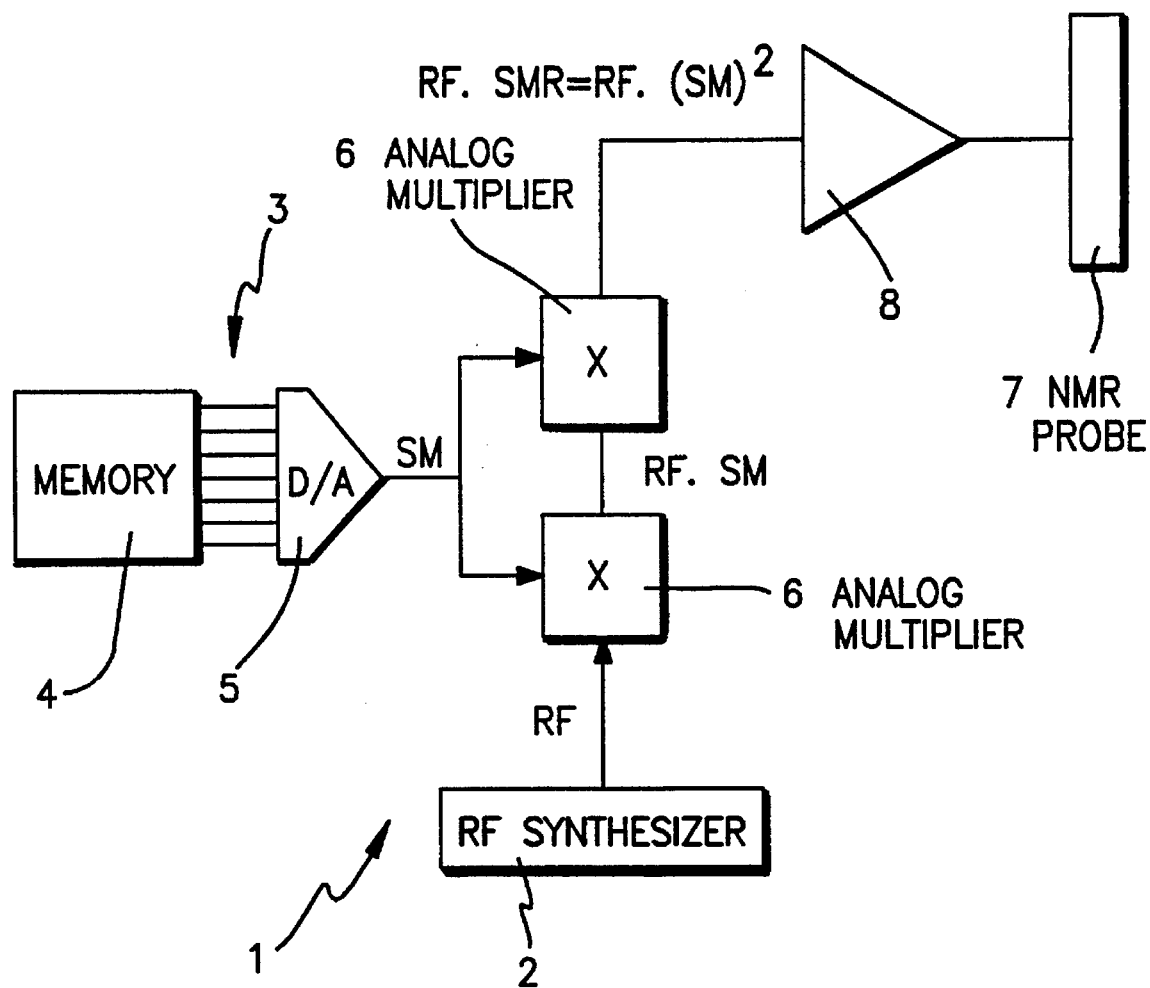

United States Patent

Loewenguth et al.

[11] Patent Number: 5,583,467
[45] Date of Patent: Dec. 10, 1996

[54] AMPLITUDE MODULATED RF PULSE GENERATOR

[75] Inventors: Bernard Loewenguth; Jean M. Tyburn, both of Wissembourg, France

[73] Assignee: Sadis Bruker Spectrospin Societe Anonyme de Diffusion de l'Instrumentation Scientifique Bruker Spectrospin, Wissembourg, France

[21] Appl. No.: 436,807

[22] Filed: May 5, 1995

[30] Foreign Application Priority Data

May 5, 1994 [FR] France .................................. 94 05710

[51] Int. Cl.⁶ .................. H03C 1/02; H03K 7/02
[52] U.S. Cl. .................. 332/115; 332/151; 375/268; 375/300; 455/102; 455/108
[58] Field of Search .................. 332/115, 116, 332/151, 152, 153, 154; 455/102, 108; 375/268, 300

[56] References Cited

U.S. PATENT DOCUMENTS 5,047,705  9/1991  Kishi ........................ 332/151
5,237,286  8/1993  Kimura et al. ............. 331/151

Primary Examiner—Siegfried H. Grimm
Attorney, Agent, or Firm—Young & Thompson

[57] ABSTRACT

Device and process for the generation of amplitude-modulated radiofrequency excitation pulses. A first unit (2) delivers a radiofrequency signal of constant level and a second unit (3) delivers a modulation signal of the radiofrequency signal, formed from numerical data. At least two analog multipliers (6) are connected in cascade as to the radiofrequency signal (RF) from the first unit (2) and are supplied in parallel by the modulation signal (SM) from the second unit (3). For n multipliers (6) in cascade, with $n \geq 2$, the modulation signal (SM) delivered to the n multipliers (6) is of the $A^{1/n}.f(t)$ type, $A.f(t)$ being the desired resulting modulation signal (SMR). The second unit (3) is a memory (4) containing point by point the envelope of the modulation signal $A^{1/n}.f(t)$ and a digital/analog converter (5) whose output is connected to the inputs in parallel of the n analog multipliers (6) in cascade.

6 Claims, 2 Drawing Sheets

AMPLITUDE MODULATED RF PULSE GENERATOR

The present invention relates to the field of Nuclear Magnetic Resonance (NMR), more particularly the systems for the selective excitation of specimens, and has for its object a device for the generation of radiofrequency excitation pulses and a process using said device.

At present, NMR experiments use more and more frequently radiofrequency excitation pulses of complex shape, and no longer simply square pulses.

These radiofrequency pulses modulated in amplitude permit, for example, irradiating a precise portion of the NMR spectrum of the specimen, hence the term selective excitation.

The known process used to define the complex envelope of an RF radiofrequency excitation impulse will be described in greater detail hereafter.

To begin with, the desired envelope is calculated point by point, which is to say the amplitude of the RF impulse is defined point by point and the assembly of the resulting values is stored in a memory which is progressively read by the computer controlling the assembly of the process, when the NMR experiment is begun.

The said memory is connected to a digital/analog converter which transforms the digital data (for example of 12 bits) from the memory, into an analog signal which will control a radiofrequency modulator, for example of the ring modulator type, permitting modulating a radiofrequency signal of constant level from a synthesizer by the modulation signal stored in the memory.

This modulated radiofrequency signal is then amplified by a power amplifier before arriving at the NMR probe constituted by an excitation winding.

At present, this process, practiced at a dynamic amplitude of 50 dB and using a ring modulator controlled by a digital/analog 12-bit converter, has the drawback of relatively insufficient relative precision for low value radiofrequency levels.

Thus, the amplitude of the output radiofrequency signal varies by a constant interval of $1/4096$ ($\frac{1}{2}^{12}$) over all the dynamic of the converter; but the relative variation in dynamic height is $(4096-4095)/4096=1/4096$ ($0.02\%$), whilst below 50 dB (which is to say at 13) the relative variation is $(13-12)/13=1/13$ ($7.7\%$).

This means that an RF pulse modulated in amplitude could be defined with a much greater relative precision at the highest levels, whilst at low levels the amplitude will be less well defined.

Moreover, the digital/analog converter is excited over a wide dynamic range giving rise to relative precision variations of the conversion according to the amplitude values in question.

The present invention has particularly for its object to overcome the recited drawbacks.

To this end, it has for its object a device for the generation of radiofrequency excitation pulses modulated in amplitude, comprising essentially a first unit delivering a radiofrequency signal of constant level and a second unit delivering a modulation signal of said radiofrequency signal, formed from numerical information, characterized in that it comprises at least two analog multipliers connected in cascade as to the radiofrequency signal from the first unit and supplied in parallel by the modulation signal from the second unit.

The invention also has for its object a process for the generation of radiofrequency excitation pulses modulated in amplitude for an NMR probe, utilizing the device mentioned above, which process is characterized in that it consists in producing separately on the one hand a radiofrequency signal of substantially constant amplitude, and, on the other hand, a modulation signal by attenuation of the type $A^{1/n}.f(t)$, in then carrying out n successive analog multiplications of the radiofrequency signal by the modulation signal, with $n \geq 2$, and in delivering the resulting signal, of the RF.A.f(t) type, as the case may be after amplification, to the NMR probe.

Figure 2:
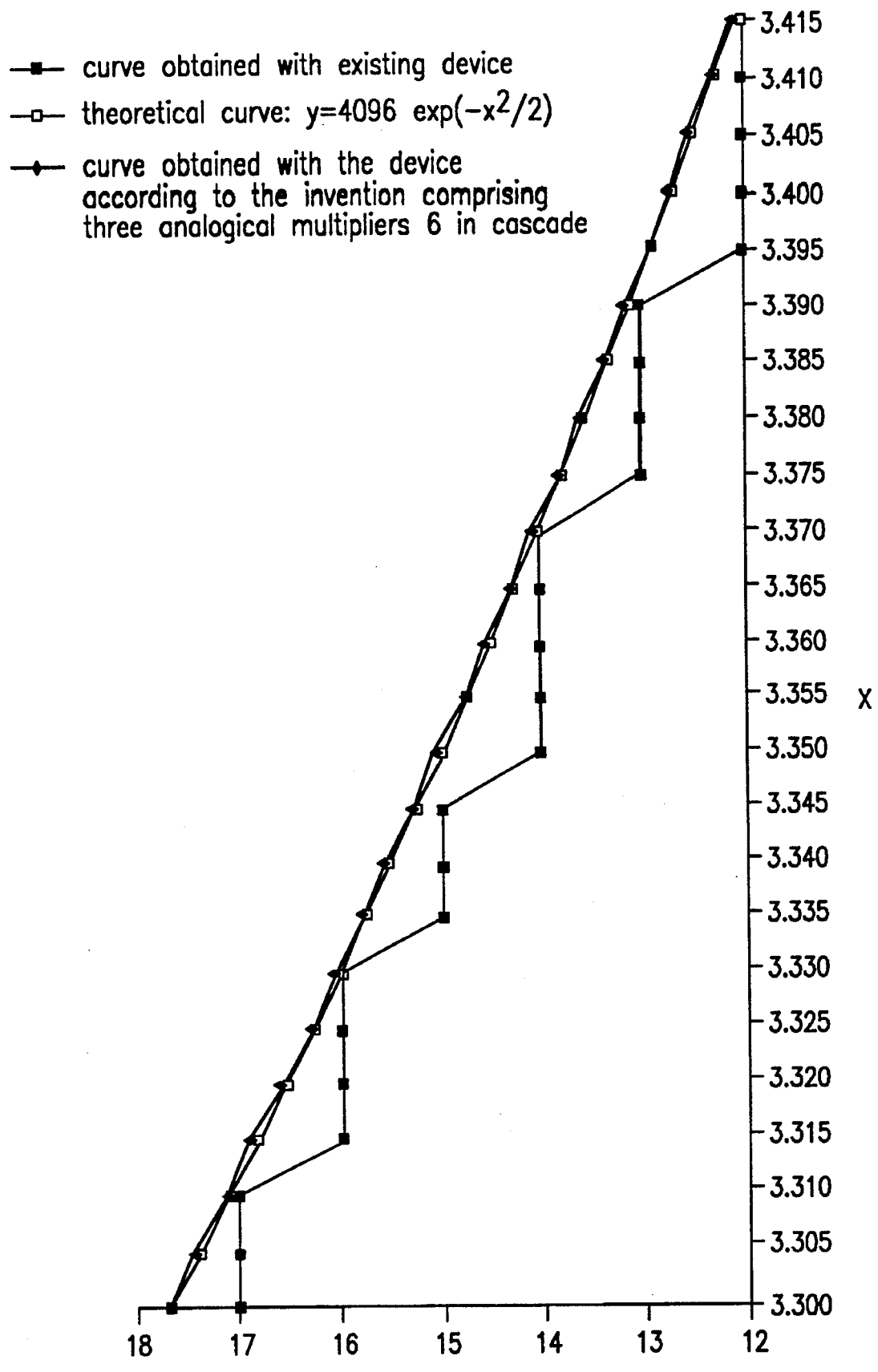

The invention will be better understood from the following description, which relates to preferred embodiments, given by way of non-limiting examples, and explained with reference to the accompanying schematic drawings, in which:

FIG. 1 is a schematic view of a device according to one embodiment of the invention, and, FIG. 2 shows comparative curves of the approximations of an envelope of a modulation signal of gaussian form, on the one hand, by means of the existing process and, on the other hand, by means of a process according to the invention, according to another embodiment of the invention.

As shown in FIG. 1 of the accompanying drawings, the device 1 for the generation of radiofrequency excitation pulses, modulated as to amplitude, comprises essentially a first unit 2, for example in the form of a radiofrequency synthesizer, delivering a radiofrequency signal RF of constant level (amplitude) and a second unit 3 delivering a modulation signal SM, adapted to modulate by attenuation said radiofrequency signal RF, this modulation signal being formed from digital data, particularly stored in a memory 4 connected to a digital/analog converter 5.

According to the invention, the device also comprises, so as to carry out said modulation, at least two analog multipliers 6 connected in cascade as to the radiofrequency RF from the first unit 2 and supplied in parallel by the modulation signal SM from the second unit 3.

The modulated signal available at the outlet of the last analog multiplier 6 in cascade is then delivered to an NMR probe 7, as the case may be after amplification by a corresponding circuit 8.

For the case in which the generating device 1 comprises n multipliers 6 in cascade, with $n \geq 2$, the modulation signal SM delivered to said n multipliers 6 is of the $A^{1/n}.f(t)$ type, A.f(t) being the resulting desired modulation signal SMR.

One of the inputs of each multiplier 6 is then connected to the output of the multiplier 6 which precedes it in the cascade or series structure, except the first, of which one of the inputs is connected to the output of the synthesizer 2, the other input of each of the n analog multipliers 6 receiving the modulation signal SM delivered by the second unit 3.

According to one characteristic of the invention, the second unit 3 is preferably constituted by a memory for containing point by point the envelope of the modulation signal $A^{1/n}.f(t)$ and by a digital/analog converter 5 whose output is connected to the inputs in parallel of the n analog multipliers 6 in cascade.

Preferably, the analog multipliers 6 in cascade, for example two or three in number, consist of four quadrant wide band analog multipliers.

The advantages obtained by the use of the generation device 1 according to the invention will become evident from an analysis of the values of Tables 1, 2 and 3 hereinafter, obtained from a resulting modulation signal of ramp shape extending over 50 dB and defined numerically at 12 bits (4096 points).

TABLE 1

| Memory (address) | SM in dB (amplitude) | SMR in dB (amplitude) | Theoretical Equivalent s/4096 pts of SMR | |
|---|---|---|---|---|
| 4096 | 0 | 0 | 4096 | |
| | | | | } 0.02% |
| 4095 | −0.002 | −0.002 | 4095 | |
| / | / | / | / | |
| / | / | / | / | |
| / | / | / | / | |
| 14 | −49.32 | −49.32 | 14 | |
| | | | | } 7.7% |
| 13 | −49.97 | −49.97 | 13 | |

TABLE 2

(Device according to the invention comprising two multipliers 6 in cascade)

| Memory (address) | SM in dB (amplitude) | SMR in dB (amplitude) | Theoretical Equivalent s/4096 pts of SMR | |
|---|---|---|---|---|
| 4096 | 0 | 0 | 4096 | |
| | | | | } 0.004% |
| 4095 | −0.002 | −0.04 | 4094 | |
| / | / | / | / | |
| / | / | / | / | |
| / | / | / | / | |
| 231 | −24.72 | −49.95 | 13.027 | |
| | | | | } 0.8% |
| 230 | −25.01 | −50.02 | 12.923 | |

TABLE 3

(Device according to the invention comprising three multipliers 6 in cascade)

| Memory (address) | SM in dB (amplitude) | SMR in dB (amplitude) | Theoretical Equivalent s/4096 pts of SMR | |
|---|---|---|---|---|
| 4096 | 0 | 0 | 4096 | |
| | | | | } 0.07% |
| 4095 | −0.002 | −0.006 | 4093 | |
| / | / | / | / | |
| / | / | / | / | |
| / | / | / | / | |
| 602 | −16.65 | −49.95 | 13.027 | |
| | | | | } 0.69% |
| 601 | −16.67 | −50.01 | 12.938 | |

As these tables show, the minimum relative precision, corresponding to the smallest interval realizable, is 7.7% for the existing device as already indicated above, 0.8% [(13.027−12.923)/13.027] for the device according to the invention comprising two analog multipliers 6 in cascade and 0.69%[(13.027−12.938)/13.027] for the device according to the invention comprising three analog multipliers 6 in cascade.

Moreover, to define the envelope of a resulting modulation signal SMR at 50 dB, it suffices to define the shape or envelope of the modulation signal SM (nth root of the envelope of the modulation signal SMR for n analog multipliers 6 in cascade), respectively at 25 dB (for two multipliers 6), 16.67 dB (for three multipliers 6) or even (50/n) dB (for n multiplier 6).

There results a substantial economy in memory space used for the storage of the signal modulation envelope, as well as an important gain in signal to noise ratio.

Moreover, the digital/analog converter 5 works across a restricted range of its dynamic and in the region in which its relative precision is the highest (25 first decibels for two multipliers 6 in cascade).

Moreover, the fact of raising to the square, the cube or the power n in an analog manner, the modulation signal SM, transposes the relative precision of the converter 4 to 25 dB, 16.67 dB or 50/n dB, to 50 dB for the resulting modulation signal SMR and therefore for the modulated radiofrequency signal transmitted to the NMR probe 7.

The increase in precision of the definition of envelope shapes of complex modulation signals is also nicely achieved by comparing the three portions of the curves of FIG. 2 of the accompanying drawings, obtained for low values of a gaussian form of the type $y=4096 \exp(-x^2/2)$.

The invention also has for its object a process for the generation of amplitude-modulated radiofrequency excitation pulses for an NMR probe 7, utilizing the device 1 as described above, said process consisting principally in producing separately, on the one hand, a radiofrequency signal RF of substantially constant amplitude and, on the other hand, a modulation signal SM by attenuation, of the $A^{1/n}.f(t)$ type, in then effecting n successive analog multiplications of the radiofrequency signal RF by the modulation signal SM, with $n \geq 2$, and in delivering the resulting RF.SMR signal, of the RF.A.f(t) type, as the case may be after amplification, to the NMR probe 7 ($SMR=SM^n=[A^{1/n}.f(t)]^n=A.f(t)$).

The generation and transmission of the modulation signal SM consists essentially in extracting the envelope of the modulation signal SM from a memory 4 in which it is stored point by point in numerical form, then in applying the numerical values successively read in said memory 4 to a digital/analog converter 5 and then delivering the output signal of said converter 5, in parallel, to one of the inputs of each of the multipliers 6 of an assembly of n analog multipliers 6 in cascade, so as to perform n successive analog multiplications, preferably two or three, of the radiofrequency signal RF by the modulation signal $SM=A^{1/n}.f(t)$.

Of course, the invention is not limited to the embodiment described and shown in the accompanying drawings. Modifications remain possible, particularly as to the construction of the various elements, or by substitution of technical equivalents, without thereby departing from the scope of protection of the invention.

We claim:

1. In a device for the generation of amplitude-modulated radiofrequency excitation pulses, comprising a first unit delivering a radiofrequency signal of constant level and a second unit delivering a modulation signal of said radiofrequency signal, formed from digital data; the improvement comprising at least two analog multipliers (6) connected in cascade as to the radiofrequency signal (RF) from the first unit (2) and supplied in parallel by the modulation signal (SM) from the second unit (3).

2. Device according to claim 1, wherein for n multipliers (6) in cascade, with $n \geq 2$, the modulation signal (SM) delivered to said n multipliers (6) is of the $A^{1/n}.f(t)$ type, $A.f(t)$ being the desired resulting modulation signal (SMR).

3. Device according to claim 2, wherein the second unit (3) is constituted by a memory (4) containing point by point the envelope of the modulation signal $A^{1/n}.f(t)$ and by a digital/analog converter (5) whose output is connected to the inputs in parallel of the n analog multipliers (6) in cascade.

4. Device according to claim 1, wherein said analog multipliers (6) consist of four quadrant wide band analog multipliers.

5. Device according to claim 1, which comprises two said analog multipliers (6) in cascade.

6. Device according to claim 1, which comprises three said analog multipliers (6) in cascade.

* * * * *